United States Patent [19]

Kuwabara et al.

[11] Patent Number: 4,638,308

[45] Date of Patent: Jan. 20, 1987

[54] CRT PICTURE DISPLAY APPARATUS

[75] Inventors: Hiroshi Kuwabara, Hitachi; Jushi Ide, Mito; Yasuji Kamata, Hitachi; Kenkichi Yamashita, Katsuta, all of Japan

[73] Assignee: Hitachi, Ltd., Tokyo, Japan

[21] Appl. No.: 654,390

[22] Filed: Sep. 26, 1984

[30] Foreign Application Priority Data

Sep. 28, 1983 [JP] Japan ................... 58-178041

[51] Int. Cl.⁴ ............................................. G09G 1/08
[52] U.S. Cl. ................................... 340/736; 340/744
[58] Field of Search ............... 340/732, 736, 737, 740, 340/742, 744, 745, 746, 800, 805, 747, 748

[56] References Cited

U.S. PATENT DOCUMENTS

| 3,145,378 | 8/1964 | Lyons, Jr. | 340/744 |
| 3,164,822 | 1/1965 | Uphoft | 340/744 |
| 3,706,905 | 12/1972 | Alexander | 340/736 |
| 4,222,048 | 9/1980 | Johnson | 340/736 |
| 4,491,835 | 1/1985 | Aron | 340/736 X |
| 4,511,892 | 4/1985 | Grothe | 340/736 X |

Primary Examiner—Gerald L. Brigance
Assistant Examiner—Vincent L. Kovalick
Attorney, Agent, or Firm—Antonelli, Terry & Wands

[57] ABSTRACT

A CRT picture display apparatus of the raster scan type comprises a cathode ray tube for raster scanning, a horizontal deflection circuit for supplying a horizontal deflection current to a horizontal deflection coil of the CRT, a vertical deflection circuit for supplying a vertical deflection current to a vertical deflection coil of the CRT, and a display data generator for supplying data to be displayed to the CRT. The horizontal deflection circuit produces as the horizontal deflection current a triangular current having one period which is twice a horizontal scanning period, and the triangular current has a first portion which increases in response to a horizontal sync signal at a predetermined inclination and a second portion which decreases in response to the next horizontal sync signal at the predetermined inclination and continues until the further next horizontal sync signal, whereby the period for a scanning line to proceed from lefthand end to righthand end of a raster on a screen of the CRT is made substantially equal to the period for the next scanning line to proceed from righthand end to lefthand end, and data is displayed during both the periods.

5 Claims, 14 Drawing Figures (a) HORIZONTAL DEFLECTION CURRENT $I_H$ (b) HORIZONTAL DEFLECTION VOLTAGE $V_H$ (c) DISPLAY DATA SIGNAL (d) HORIZONTAL SYNC SIGNAL $S_V$

CRT PICTURE DISPLAY APPARATUS

This invention relates to a picture display apparatus and more particularly to a picture display apparatus for display of high density pictures of the raster scan type utilizing an electromagnetic deflection type CRT (cathode ray tube).

FIG. 1 shows a typical example of raster scanning according to a prior art picture display apparatus of the raster scan type utilizing an electromagnetic deflection type CRT. In this prior art raster scanning, a picture is displayed as the scanning proceeds from lefthand end to righthand end of a screen 1 as shown in FIG. 1 but the raster is erased so as not to display the picture as the scanning proceeds from righthand end to lefthand end within a short time interval (about $0.15 \times T_H$ where the period for horizontal deflection is represented by $T_H$) during a so-called black-out.

The picture display apparatus of this type comprises, as schematically shown in FIG. 2, a CRT 10 including an electron gun 2, a horizontal deflection coil 3, a vertical deflection coil 4, a display data generator 12, a horizontal deflection circuit 14, and a vertical deflection circuit 16. With this construction, an electron beam 5 subject to a display data from the display data generator 12 is emitted from the electron gun 2 and deflected by magnetic fields generated from the deflection coils 3 and 4 supplied with deflection currents from the deflection circuits 14 and 16 so as to draw the raster on the screen 1. In addition, a voltage on an electrode (not shown) of the electron gun 2 is controlled to vary the intensity of the electron beam 5, so that the raster is modulated in darkness and brightness to display a picture on the screen.

FIG. 3 is a circuit diagram showing the construction of the display data generator 12. Referring to FIG. 3, a memory 20 written with display data inputted from outside is a refresh memory capable of storing a data for one frame of the screen, and a shift register 22 stores a data for one horizontal period read out of the refresh memory 20 and sequentially outputs the stored data to the CRT 10. The refresh memory 20 is responsive to a write signal supplied from outside to write an external display data for one frame and is also responsive to a read signal in synchronism with a horizontal sync signal $S_H$ to transfer, in parallel, a data for one horizontal period to the shift register 22 at each one horizontal period. The shift register 22 then responds to a shift clock to output the stored data sequentially or serially to the CRT. Since a shift-left control terminal of the shift register 22 is applied with a signal $V_{cc}$ for controlling the direction of data shifting while a shift-right control terminal is applied with earth potential, the data is shifted to the left in accordance with the shift clock. In this manner, the direction of data shifting in the shift register is kept unidirectional and as a result, data at bit positions b $2^n, 2^{n-1}, 2^{n-2}, \ldots, 2^0$ are sequentially fed to the CRT 10. The shift register 22 is also applied with a mode control signal which is either a write mode signal for causing the shift register 22 to write data from the refresh memory 20 or a read mode signal for causing the shift register 22 to sequentially output the stored data.

The conventional raster scanning of CRT 10 will now be described in greater detail by taking, for instance, 1000 horizontal scanning lines per one screen (one frame) wherein a horizontal deflection frequency of 50 KHz and a vertical deflection frequency of 50 Hz are used for scanning.

In the prior art system, a horizontal deflection current $I_H$ of a saw-tooth waveform as shown at section (a) in FIG. 4 is passed through the horizontal deflection coil 3 of FIG. 2. The waveform characteristic of this current $I_H$ gradually increases within a time interval (17 μS) which is 85% of a horizontal scanning period $T_H$ (20 μS) equivalent to the horizontal deflection period set out previously and rapidly decreases within a short time interval $T_{HR}$ (3 μS) which measures 15% of the $T_H$. The horizontal deflection coil 3 has an inductance of about 100 μH and hence a horizontal deflection voltage $V_H$ developing across the coil 3 during the time interval for gradual increase of the horizontal deflection current $I_H$ becomes, $$V_H = L_H \cdot \frac{dI_H}{dt} \qquad (1)$$

$$= 100 \, [\mu H] \times \frac{12 \, [A]}{(20 - 3) \, [\mu S]}$$

$$\simeq 71 \, [V]$$

and during the time interval for rapid decrease of $I_H$ (horizontal black-out period), it becomes, $$V_H = L_H \cdot \frac{dI_H}{dt} \qquad (2)$$

$$= 100 \, [\mu H] \times 12 \, [A] \cdot \frac{d}{dt} \cos \omega t$$

$$= 100 \times 12 \times 2\pi f \times (-\sin 2\pi ft)$$

where f is a resonance frequency during blanking which is related to the blanking period $T_{HR}$ of 3 μS as follows:

$$f = \frac{1}{2T_{HR}} = \frac{1}{2 \times 3 \, [\mu S]} \qquad (3)$$

$$= \frac{1}{6} \, [MHz]$$

Thus, the horizontal deflection voltage $V_H$ has a waveform as shown at (b) in FIG. 4. Accordingly, the horizontal deflection voltage $V_H$ as expressed by the equation (2) has a peak level $V_{HP}$ which amounts up to, $$V_{HP} = 100 \, [\mu S] \times 12 \, [A] \times 2\pi \times \frac{1}{6} \, [MHz] \qquad (4)$$

$$= 1256 \, [V]$$

A transistor (not shown) for controlling the horizontal deflection current $I_H$ is required to have a high dielectric strength in proportion to the peak level $V_{HP}$, resulting in an extremely high grade transistor. In addition, the large change of the horizontal deflection current $I_H$ during blanking is liable to the generation of high frequency noises followed by undesired display of noise on the screen.

An object of this invention is to provide a CRT picture display apparatus based on a horizontal deflection scheme which can suppress the peak level of horizontal deflection voltage to a minimum.

To accomplish the above object, according to this invention, the period for a horizontal scanning line to proceed from lefthand end to righthand end of the screen is made equal to the period for the next horizontal scanning line to proceed from righthand end to lefthand end during the horizontal deflection, and the periods for the bidirectional horizontal scanning are utilized for display of pictures.

The present invention will be apparent from the following detailed description taken in conjunction with the accompanying drawings, in which.

Preferred embodiments of a CRT picture displaY apparatus according to the invention will now be described with reference to FIGS. 5 to 14.

Figure 1:
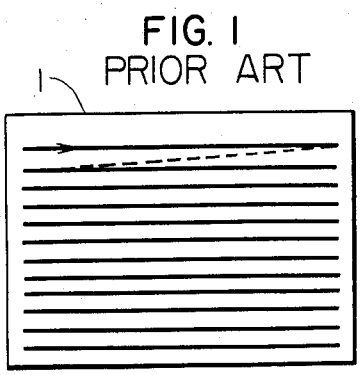
FIG. 1 is a diagram showing the raster scan in a prior art CRT picture display apparatus.
Figure 2:
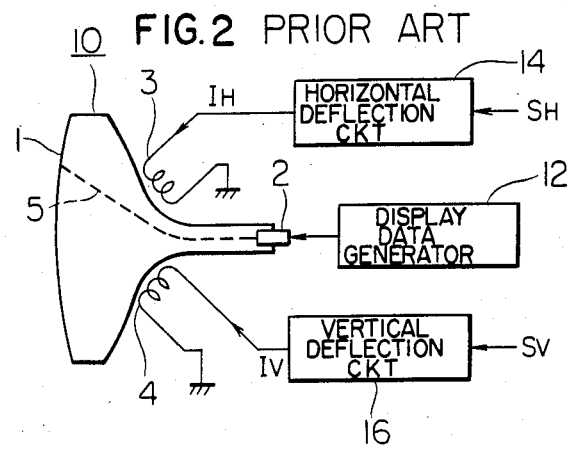
FIG. 2 is a schematic diagram of the prior art CRT picture display apparatus.
Figure 5:
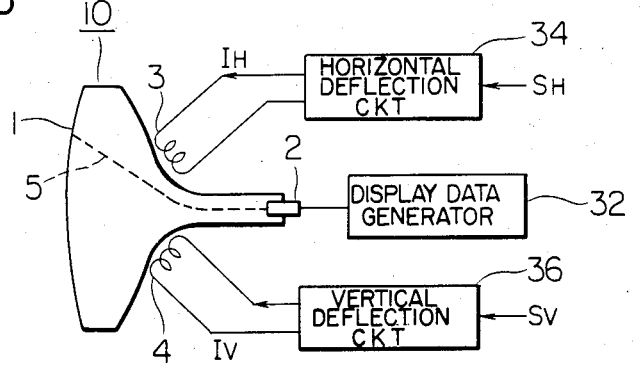
FIG. 5 is a schematic diagram of a CRT picture display apparatus according to the invention.

The construction of the CRT picture display apparatus according to the invention is schematically illustrated in FIG. 5 where the same components as those of FIG. 2 are designated by the same reference numerals and a display data generator, a horizontal deflection circuit and a vertical deflection circuit which are characteristic of the present invention are denoted by reference numerals 32, 34 and 36, respectively.

Figure 6:
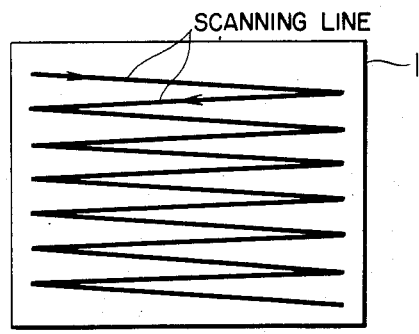
FIG. 6 is a diagram showing the manner of raster scanning according to a first embodiment of the invention.
Figure 7:
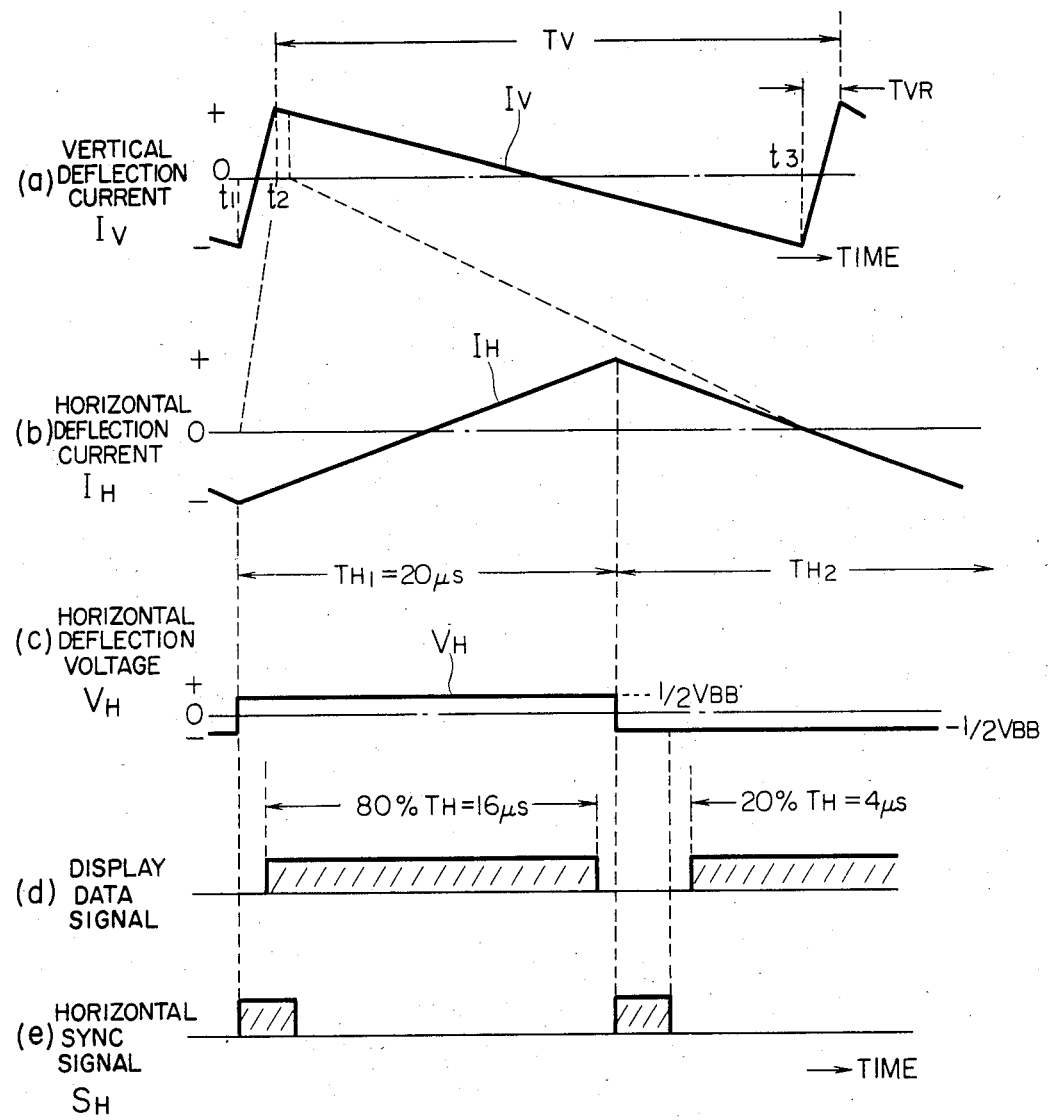
FIG. 7 shows signal waveforms appearing in the first embodiment.

The manner of raster scanning according to a first embodiment of the invention is diagrammatically shown in FIG. 6, and waveforms of deflection currents, a deflection voltage and so on appearing in the first embodiment are illustrated in FIG. 7. According to the horizontal scan scheme of this embodiment, as shown in FIG. 6, the period for a scanning to proceed from lefthand end to righthand end of a screen 1 is made equal to the period for the next scanning to proceed from righthand end to lefthand end, and the periods for the bidirectional horizontal scanning are utilized for display of pictures.

To materialize this type of horizontal scanning, a vertical deflection current $I_V$ as shown at (a) in FIG. 7, identical to that of the conventional scheme, suffices but a horizontal deflection current $I_H$ is required to have a waveform as shown at (b) in FIG. 7. More specifically, when denoting one horizontal scanning period by $T_H$, the horizontal deflection current $I_H$ increases at a predetermined inclination (positive) within a horizontal period $T_{H1}$ and decreases at the same inclination (negative) within a subsequent horizontal period $T_{H2}$. In this case, the horizontal period $T_{H1}$ corrresponds to the period for a scanning line to proceed from lefthand end to righthand end and the horizontal period $T_{H2}$ to the period for the next scanning line to proceed from righthand end to lefthand end. When the horizontal deflection coil in this embodiment has the same inductance as in the FIG. 2 prior art example, i.e., 100 μH, a voltage $V_H$ developing across the horizontal deflection coil becomes $$V_H = L_H \cdot \frac{dI_H}{dt} \qquad (5)$$

$$= 100\ [\mu H] \times \frac{12\ [A]}{20\ [\mu S]}$$

$$= 60\ [V]$$

at the most. Thus, this embodiment is effective to prevent the generation of the peak voltage $V_{HP}=1256\ [V]$ (see equation (4)) inherent to the prior art scheme.

Figure 8:
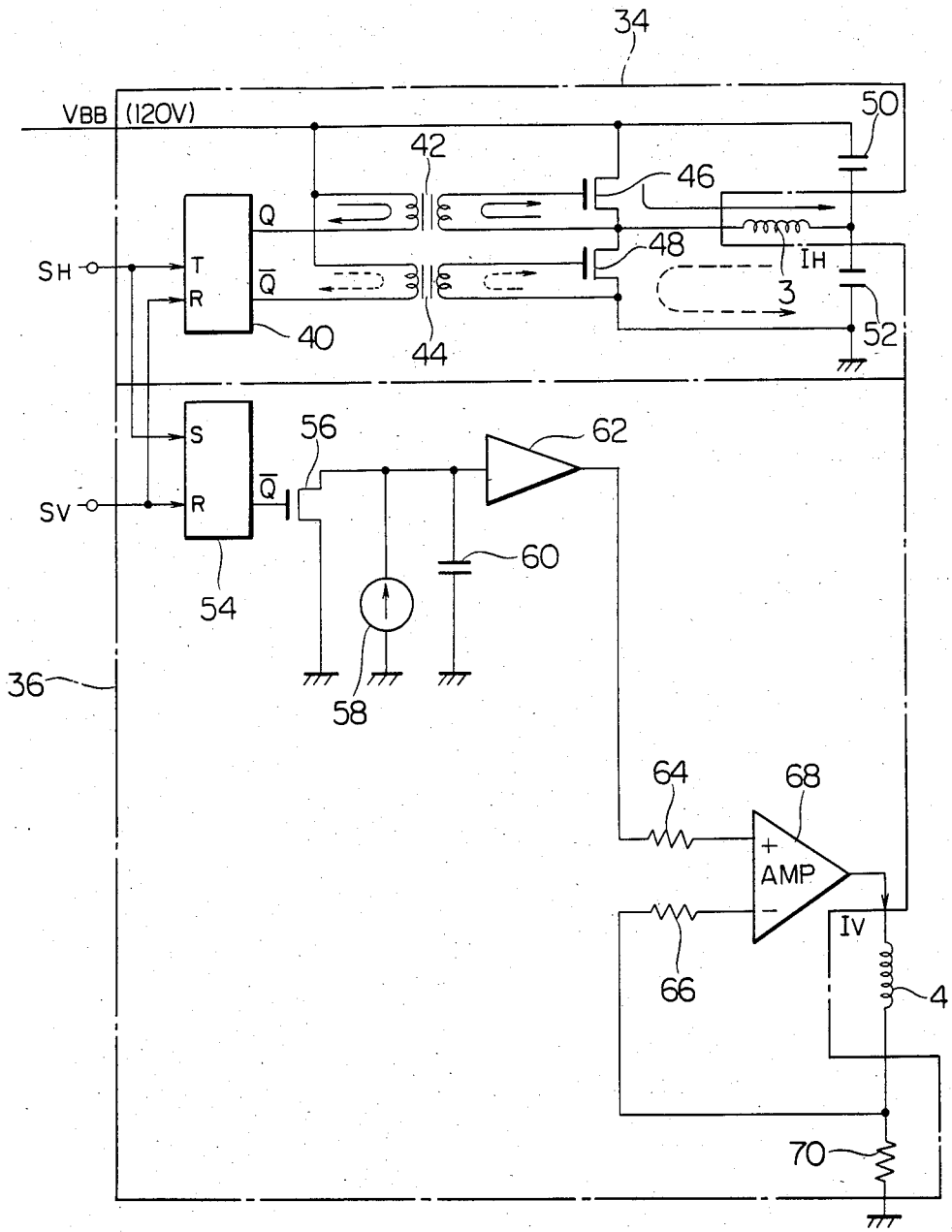
FIG. 8 is a circuit diagram showing horizontal and vertical deflection circuits for implementation of the first embodiment.

The vertical deflection circuit 36 and horizontal deflection circuit 34 for implementing the present embodiment will now be described with reference to a circuit diagram of FIG. 8.

In the horizontal deflection circuit, the horizontal deflection 3 has one end connected to a junction of serially connected capacitors 50 and 52 and the other end connected to a junction of serially connected field effect transistors (FETs) 46 and 48. The FET 46 has a gate connected to one end of a secondary winding of a transformer 42, and the FET 48 has a gate connected to one end of a secondary winding of a transformer 44. Primary windings of the respective transformers 42 and 44 are connected, at one end, in common to a DC power supply of voltage $V_{BB}$ and connected, at the other end, to a Q output and a $\overline{Q}$ output of a flip-flop 40, respectively. The flip-flop 40 has a trigger input T applied with a horizontal sync signal $S_H$ and a reset input R applied with a vertical sync signal $S_V$. The operation of the horizontal deflection circuit 34 will now be described.

The Q output and $\overline{Q}$ output of the flip-flop 40 are inverted each time the horizontal sync signal $S_H$ is inputted to the trigger input T. Firstly, assuming that the Q output is at a low level and the $\overline{Q}$ output at a high level, a current from the power supply is drawn into the primary winding of the transformer 42 in a direction of a solid line arrow to cause a current to flow through the secondary winding in a direction of a solid line arrow, thereby turning on the FET 46. As a result, a current from the power supply is drawn into the capacitor 52 via the FET 46 and coil 3.

Subsequently, the Q output bears the high level and the $\overline{Q}$ output the low level so that a power supply current is drawn into the primary winding of the transformer 44 in a direction of a dotted line arrow with FET 48 turned on and the FET 46 turned off, thereby causing a power supply current to flow into the FET 48 via the capacitor 50 and coil 3 in a direction of a dotted line arrow. In this manner, currents flow through the horizontal deflection coil 3 alternately in the opposite directions in synchronism with the horizontal sync signal to produce the waveform shown at (b) in FIG. 7. If the capacitors 50 and 52 have the same capacitance, then the power supply voltage, $V_{BB}$, will be equally divided to provide a potential of $\frac{1}{2} V_{BB}$ at the junction of the capacitors 50 and 52. Consequently, a voltage of $+\frac{1}{2}V_{BB}$ and a voltage of $-\frac{1}{2}$ are applied alternately across the coil 3 to thereby produce a horizontal deflection voltage $V_H$ as shown at (c) in FIG. 7. Therefore, by letting the inductance of the coil 3 be L, the horizontal deflection current $I_H$ is indicated by the following equation (6):

$$I_H = \pm \frac{1}{L} \int_0^{T_H} \tfrac{1}{2} V_{BB}\, dt \tag{6}$$

In the vertical deflection circuit 36, the vertical deflection coil 4 is connected, at one end, to an output of an operational amplifier 68 and at the other end to the earth through a current detecting resistor 70. A flip-flop 54 has a set input S connected to receive the horizontal sync signal $S_H$, a reset input R connected to receive the vertical sync signal $S_V$, and a $\overline{Q}$ output connected to a gate of an FET 56. A source of the FET 56 is connected to an output terminal of a constant current source 58, one end of an integration capacitor 60, and an input of a buffer amplifier 62. An output of the buffer amplifier 62 is connected to a non-inverting input of the operational amplifier 68 via an adding resistor 64. The output of the operational amplifier 68 is grounded via the vertical deflection coil 4 and the resistor 70. An inverting input of the operational amplifier 68 is applied with a voltage proportional to a current $I_V$ detected by the resistor 70 via a resistor 66.

The vertical deflection circuit of the above construction operates as follows: Referring to section (a) in FIG. 7, when the vertical sync signal $S_V$ is applied to the reset input of the flip-flip 54 at a time $t_1$, its $\overline{Q}$ output bears a low level and an output current from the constant current source 58 is rapidly charged into the capacitor 60. With the horizontal sync signal $S_H$ applied to the set input S at a time $t_2$, the $\overline{Q}$ output bears a high level to turn on the FET 56, followed by discharge of an electric charge stored in the capacitor 60 via the FET 56. Consequently, the buffer amplifier 62 produces an output current having a triangular waveform analogous to the waveform shown at (a) in FIG. 7 which in turn is drawn into the coil 4 via the operational amplifier 68. Therefore, the deflection current $I_V$ flowing in the vertical deflection coil 4 has the waveform shown at (a) in FIG. 7.

Subsequently, the vertical sync signal $S_V$ is applied to the reset input R of the flip-flop 54 at a time $t_3$ and the capacitor 60 is recharged. Therefore, the period of the vertical deflection current $I_V$ is made equal to the period $T_V$ of the vertical sync signal $S_V$. At section (a) in FIG. 7, $T_{VR}$ represents a vertical blanking period.

Figure 9:
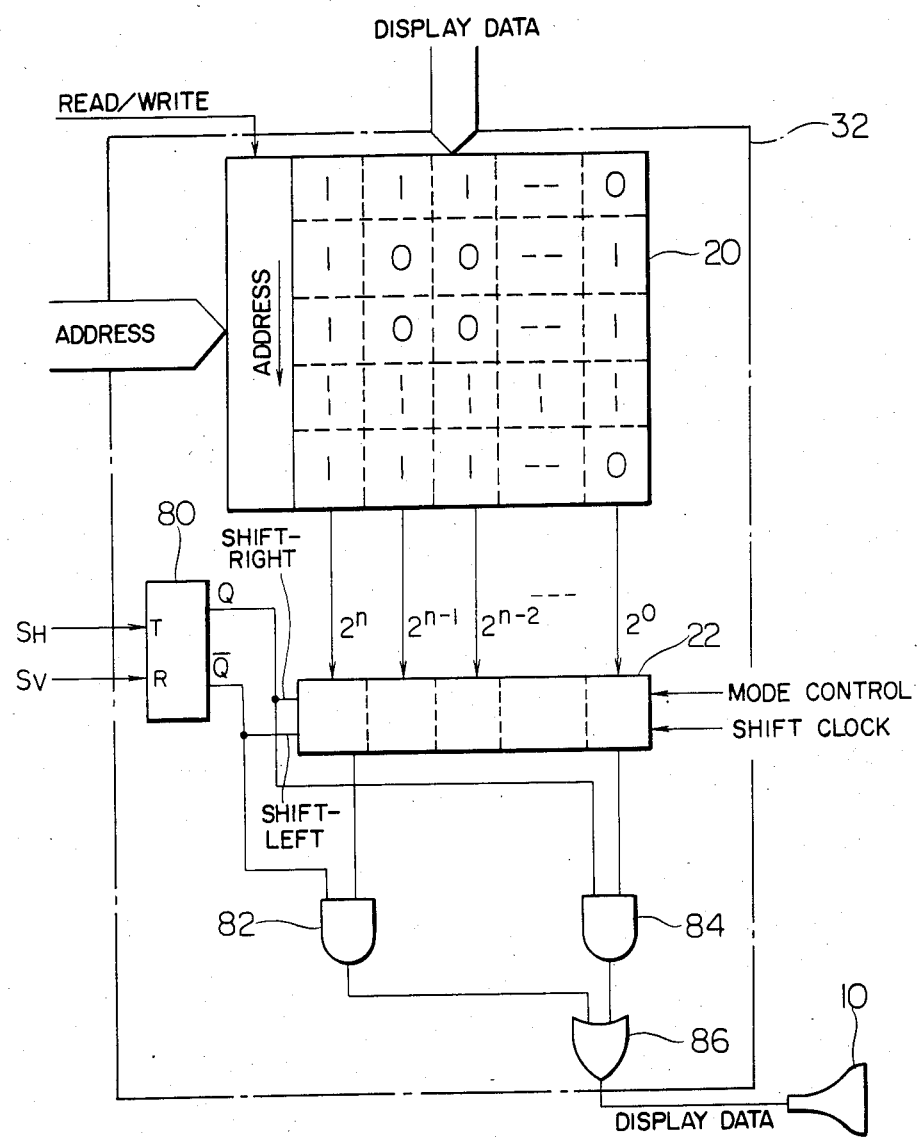
FIG. 9 is a circuit diagram of a display data generator for implementation of the first embodiment.

Referring now to FIG. 9, the construction of the display data generator 32 adapted to feed display data to the CRT 10 for implementation of the present embodiment will be described.

The display data generator may be built in the picture display apparatus according to the invention or may be disposed exteriorly thereof. The following description will be given of the display data generator build in the picture display apparatus.

Figure 3:
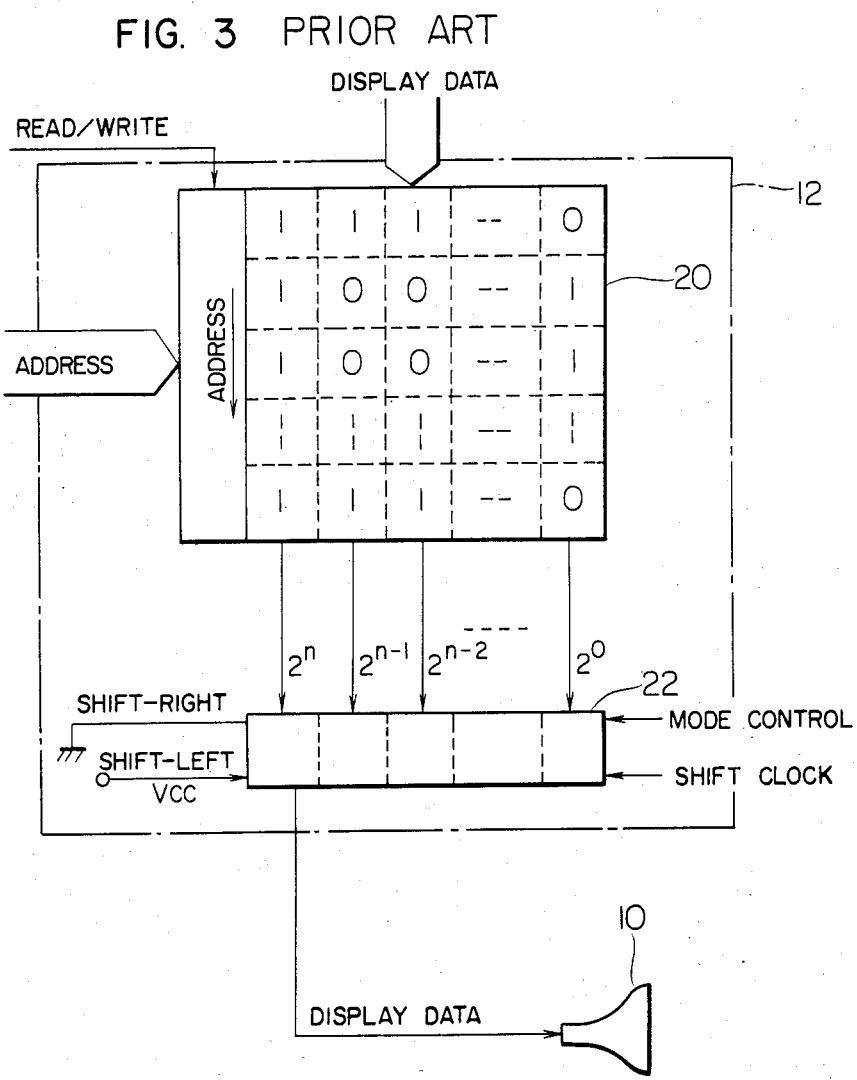
FIG. 3 is a diagram showing the construction of a display data generator in FIG. 2.
Figure 4:
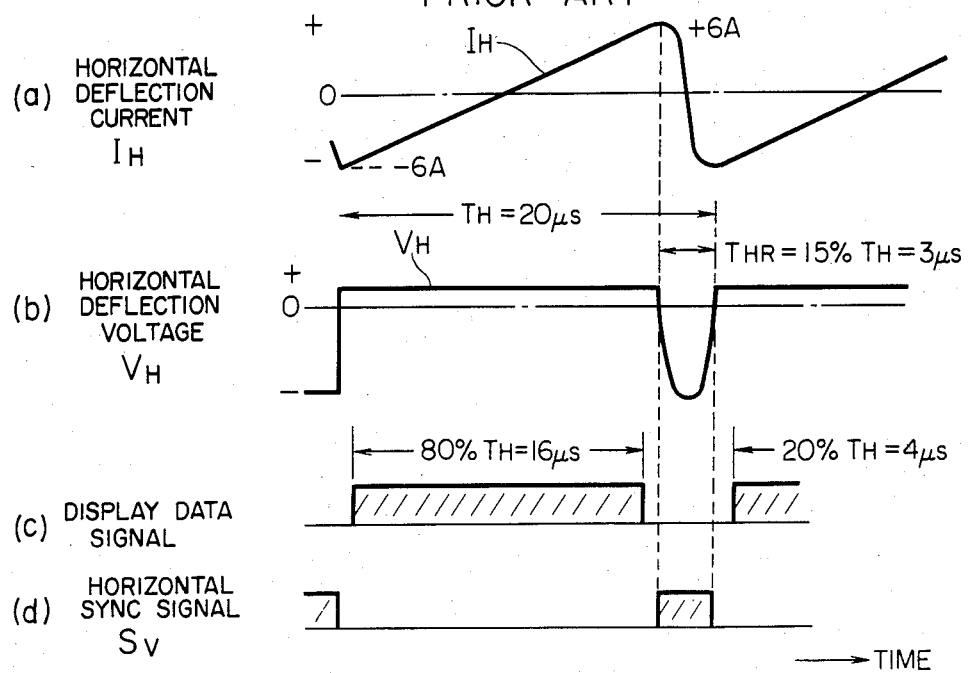
FIG. 4 is a waveform diagram of signals appearing in the FIG. 2 CRT picture display apparatus.

In the display data generator 32, a refresh memory 20 and a shift register 22 are constructed in the same manner as those of FIG. 3. In the display data generator 12 shown in FIG. 3, the shift register 22 suffices to transfer data only in one direction (to the left in FIG. 3) since the data is not displayed during the blanking period for the raster. In the present invention, however, data transfer in a shift register 22 must be bidirectional by being switched alternately to the left and to the right in order for each one scanning line to proceed since the data is displayed even during the blanking period for the raster. Therefore, according to the invention, a flip-flop 80, AND gates 82 and 84, and an OR gate 86 are added to the display data generator of FIG. 3. More specifically, the flip-flop 80 has a trigger input T connected to receive the horizontal sync signal $S_H$, a reset input R connected to receive the vertical sync signal $S_V$, a Q output connected to a shift-right control terminal of the shift register 22, and a $\overline{Q}$ output connected to a shift-left control terminal of the shift register 22. With this construction, the flip-flop 80 responds to the horizontal sync signal $S_H$ to render its Q and $\overline{Q}$ outputs high alternately, thereby ensuring that the direction of shifting data in the shift register 22 can be inverted alternately. In addition, the AND gates 84 and 82 respectively connected to the Q and $\overline{Q}$ outputs are responsive to the horizontal sync signal $S_H$ to be enabled alternately. Consequently, when the Q output is high, display data in the shift register 22 is sequentially transferred to the right in accordance with a shift clock and serially fed, in the order of $2^0, \ldots, 2^{n-2}, 2^{n-1}, 2^n$, to the CRT 10 via the AND gate 84 and OR gate 86. When the $\overline{Q}$ output is high, the display data in the shift register 22 is sequentially transferred to the left in accordance with the shift clock and serially fed, in the order of $2^n, 2^{n-1}, 3^{n-2}, \ldots, 2^0$, to the CRT 10 via the AND gate 82 and OR gate 86.

In a modification, the display data generator 32 may utilize the same hardware as that of the FIG. 3 generator on condition that data is written into the refresh memory such that the direction of writing data for each one address, i.e., for each one scanning line is inversed alternately. More specifically, the data for a particular address is sequentially written in the order of bit position $2^n, 2^{n-1}, 2^{n-2}, \ldots, 2^0$ and the data for an address next to the particular address is written sequentially in the order of bit positions $2^0, \ldots, 2^{n-2}, 2^{n-1}, 2^n$. With this modification, there is no need of inverting the direction of reading data in the shift register 22 in response to each horizontal sync signal.

Figure 10:
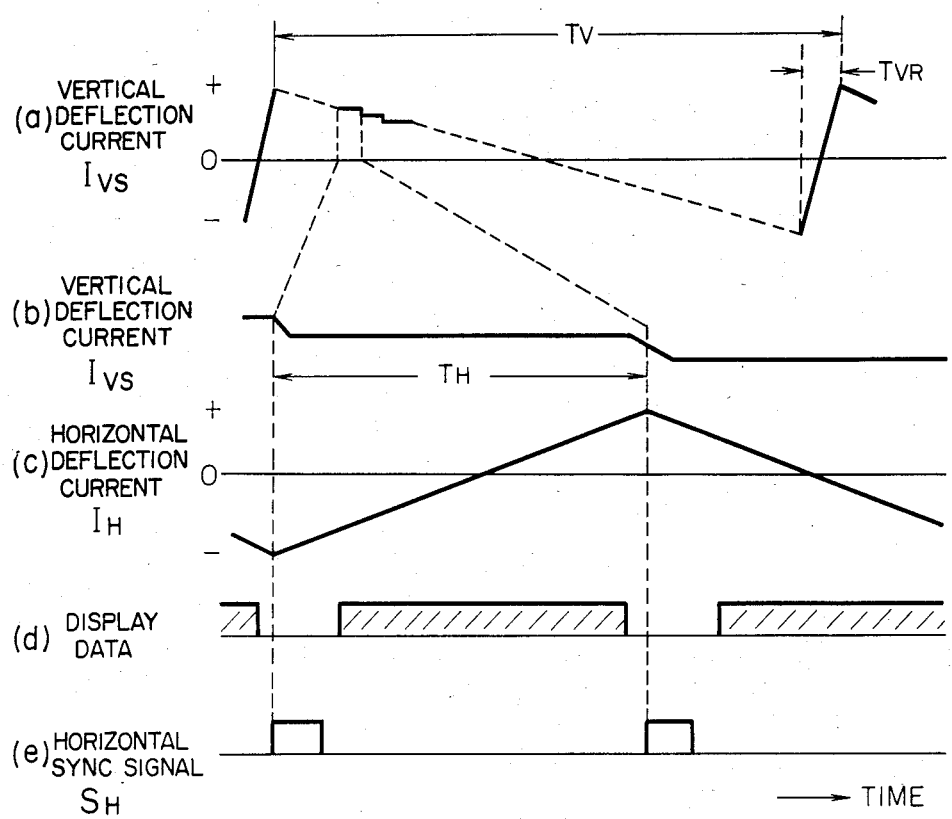
FIG. 10 shows signal waveforms appearing in a second embodiment of the invention.
Figure 11:
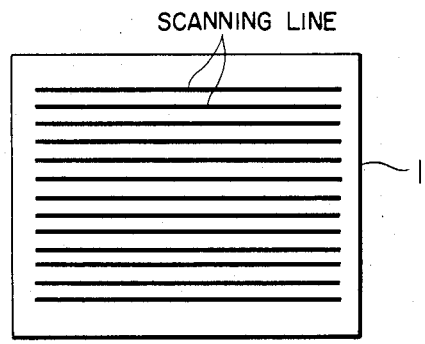
FIG. 11 is a diagrammatic representation showing the manner of raster scanning according to the second embodiment.
Figure 12:
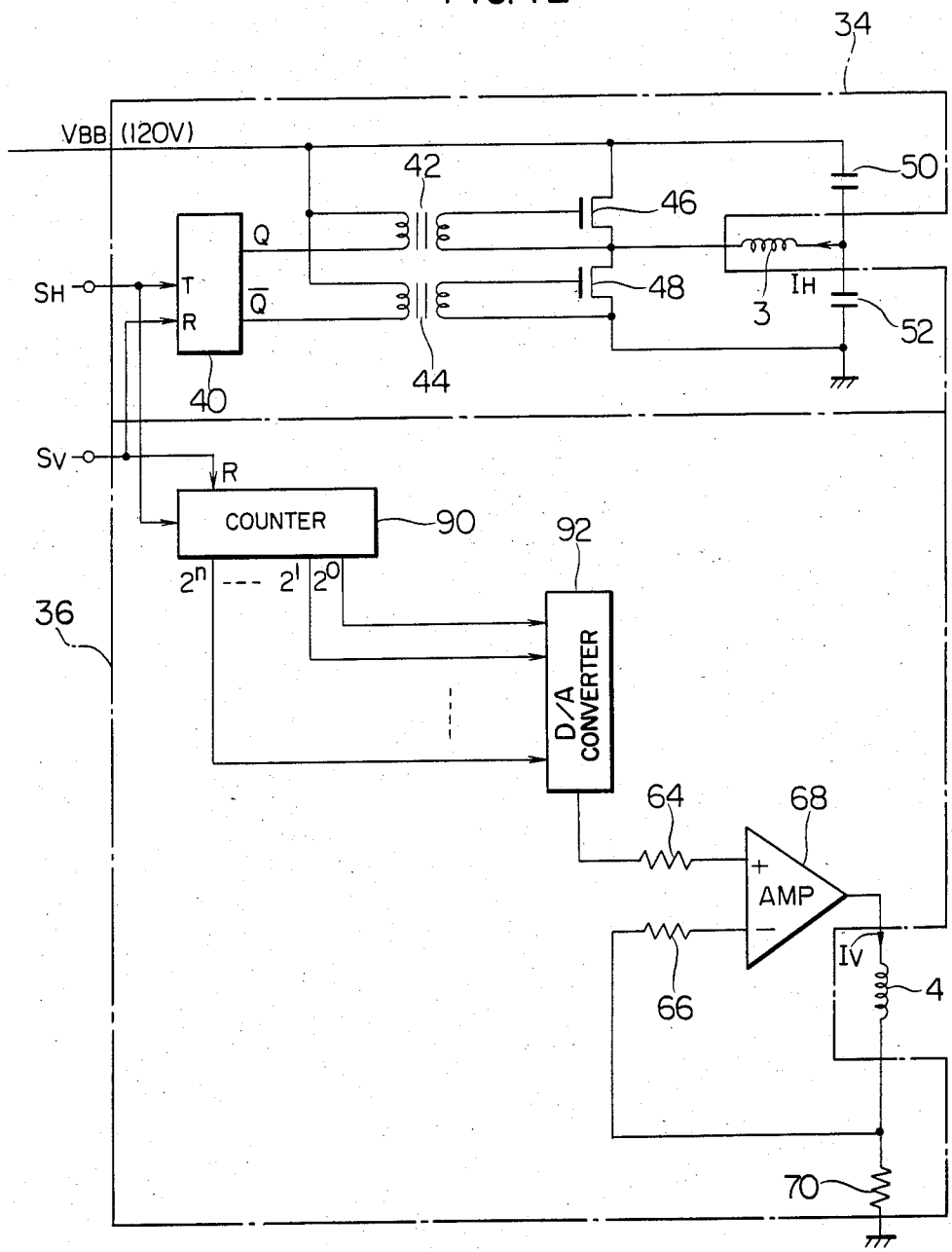
FIG. 12 is a circuit diagram showing horizontal and vertical deflection circuits for implemantation of the second embodiment.

Referring to FIGS. 10 to 12, a second embodiment of the invention will be described. In the second embodiment, the vertical deflection current $I_{VS}$ is formed into a stepped waveform in synchronism with the horizontal sync signal $S_H$ with each stepped segment having a period $T_H$ equal to that of the horizontal sync signal, as shown at sections (a) and (b) in FIG. 10. The horizontal deflection current $I_H$ is identical to that of the first embodiment. By varying the vertical deflection current $I_{VS}$ stepwise in synchronism with the horizontal sync signal described above, respective scanning lines can be arranged in parallel with each other as shown in FIG. 11. Additionally, the vertical deflection current $I_{VS}$ can readily be pulled into synchronism with the horizontal deflection current $I_H$.

FIG. 12 is a circuit diagram of a vertical deflection circuit 36 and a horizontal deflection circuit 34 which are adapted for the generation of that vertical deflection current. In FIG. 12, the horizontal deflection circuit 34 and display data generator are identical to those of the first embodiment. The vertical deflection circuit 36 shown in FIG. 12 has a counter 90 and a D/A converter 92 which substitute for the flip-flop 54, FET 56, constant current source 58, capacitor 60 and amplifier 62 of the first embodiment. In operation, the counter 90 is first reset with the vertical sync signal $S_V$ to take a value n and thereafter, its content is subtracted by one in response to the horizontal sync signal $S_H$. The content of the counter 90 is converted into an analog signal by the D/A converter 92 and fed to the operational amplifier 68 via the resistor 64. Thus, the current flowing in the vertical deflection coil 4 can be obtained, having the waveform as indicated at (a) and (b) in FIG. 10.

Figure 13:
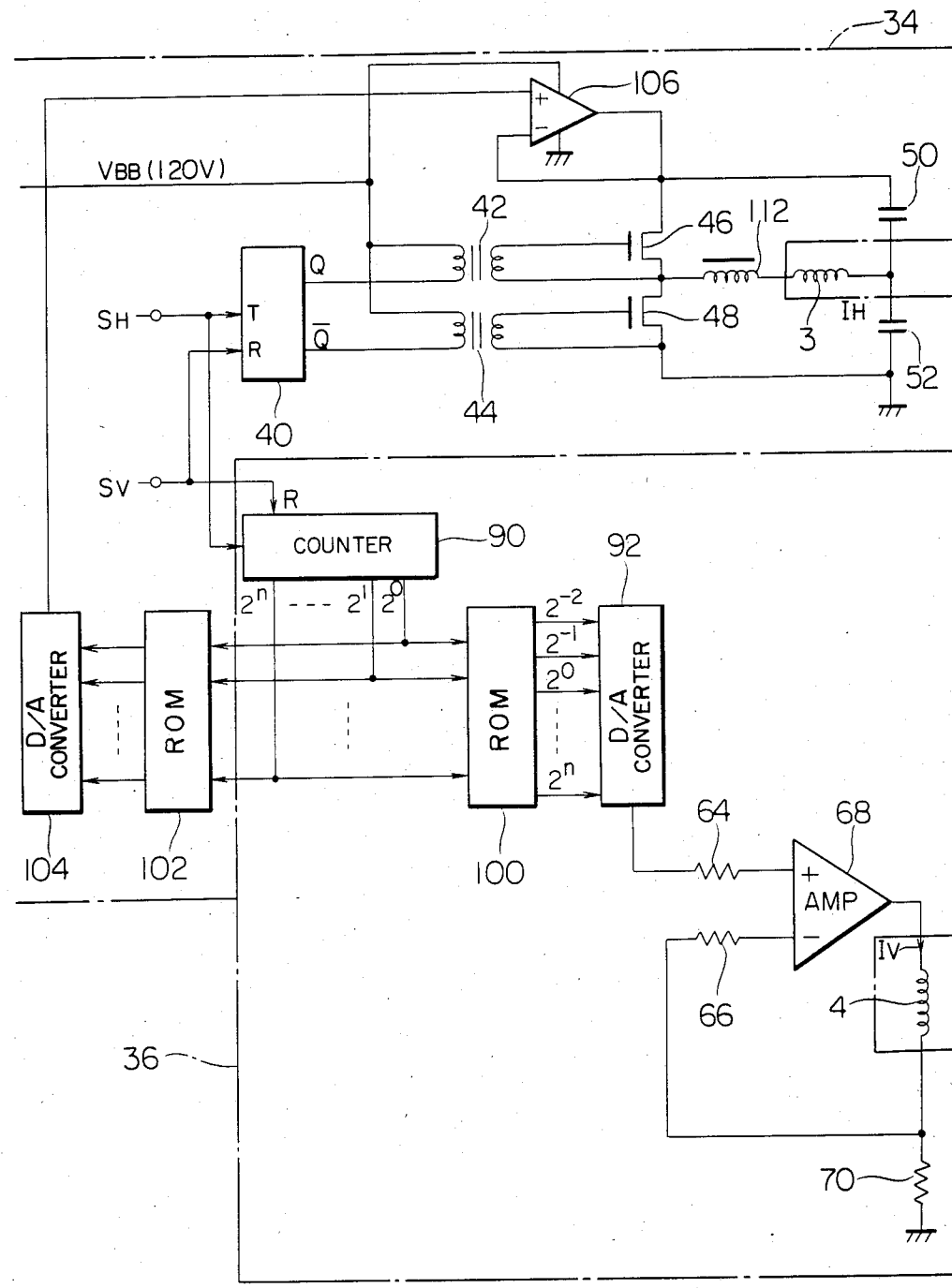
FIG. 13 is a circuit diagram of horizontal and vertical deflection circuits for implementation of a third embodiment.
Figure 14:
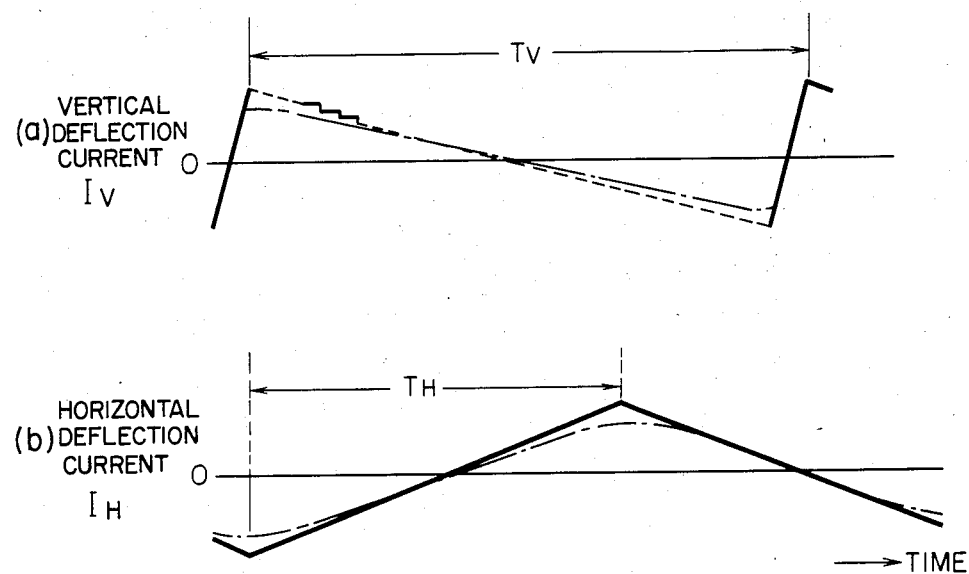
FIG. 14 shows signal waveforms appearing in the third embodiment.

FIG. 13 is a circuit diagram of horizontal and vertical deflection circuits for implementing a third embodiment of the invention. In the display apparatus for high density display of information by using 1000 scanning lines as in the present invention, it is desirable that non-linear distortion of the raster be corrected exactly. From this standpoint of view, this embodiment adds to the horizontal and vertical deflection circuits of the second embodiment the function of correcting the raster deflection, that is, the function of correcting the non-linear distortion of the raster. The deflection distortion of the raster on the scrren to be corrected by the present embodiment is due to the fact that the screen 1 of CRT 10 is not arcuate but is parabolic.

A correction circuit provided for the vertical deflection circuit 36 will first be described. A vertical deflection circuit 36 shown in FIG. 13 adds to the circuit 36 of FIG. 12 a ROM 100 which effects code conversion of the output from the counter 90 prior to delivery thereof to the D/A converter 92.

More particularly, the ROM 100 stores a great number of correction values $k' = k - \Delta k$ corresponding to values k(=0 to 1000) of the counter 90 and applies to the D/A converter 92 corresponding one correction value $k'$ in accordance with the content of the counter 90, where $\Delta k$ is so set as to be 0 (zero) for k=500 and increased in proportion to an increased deviation or a decreased deviation of k from 500. Under the application of this correction, therefore, the vertical deflection current waveform can be blunted parabolically near its positive and negative peaks as indicated by chained line at section (a) in FIG. 14. This corrected waveform prevents expansion of the raster spacing at upper and lower portions of the screen to thereby make the raster spacing uniform over the entire screen.

In the horizontal deflection circuit, a linearity coil 112 for correction of the raster non-linear distortion is connected in series with the horizontal deflection coil 3. The linearity coil 112 is a saturable reactor which saturates as the absolute value of a current flowing therethrough increases. Accordingly, the current flowing through the horizontal deflection coil 3 saturates near its positive and negative peaks and its waveform becomes parabolic as indicated by chained line at (b) in FIG. 14. In this manner, expansion of the display data spacing at lefthand and righthand ends of the screen can be prevented, thereby correcting side pincushion distortion.

Additionally, in order to make the correction for side pincushion distortion more complete, there are provided in this embodiment a ROM 102, a D/A converter 104, an operational amplifier 106, and resistors 108 and 110. In particular, the ROM 102 delivers a correction value $-k''$ corresponding to a value k of the counter 90, where $k''$ is so set as to be zero for k=500 and increased in proportion to an increased deviation or a decreased deviation of k from 500. The thus set correction values $-k''$ are converted by the D/A converter 104 into analog signals and superimposed on the power supply voltage $V_{BB}$ via the operational amplifier 106. Accordingly, the current flowing through the horizontal deflection coil 3 can be blunted parabolically to ensure the correction for side pincushion distortion.

In this embodiment, the linearity coil 102 or the circuitry of blocks 102 to 110, or both may be employed for correcting the side pincushion distortion.

As has been described, according to the present invention, the highly fine formation of display data can be materialized by increasing the number of horizontal scanning lines and in addition, the peak voltage developing across the horizontal deflection coil 3 can be reduced to a minimal value of 60 V which is about 1/20 of the peak level, 1256 V, of the conventional scheme. Accordingly, a transistor for general purpose can be chosen as the transistor for controlling the current $I_H$ drawn into the horizontal deflection coil 3, thus contributing to reduction of cost of the apparatus. In addition, the rapid change of horizontal deflection current $I_H$ responsible for the generation of picture noises can be prevented to thereby improve quality of pictures.

We claim:

1. A CRT display apparatus for the raster scan type comprising:

a cathode ray tube for raster scanning;

a horizontal deflection circuit for supplying a horizontal deflection current to a horizontal deflection coil of said cathode ray tube;

a vertical deflection circuit for supplying a vertical deflection current to a vertical deflection coil of said cathode ray tube in synchronism with a vertical sync signal; and display data generator means for supplying data to be displayed to said cathode ray tube, said horizontal deflection circuit producing as said horizontal deflection current a triangular waveform current having one period which is twice a horizontal scanning period, said triangular waveform current having a series of triangular waveforms each having a first portion which increases in response to a horizontal sync signal at a predetermined inclination and a second portion which decreases in response to the next horizontal sync signal at said predetermined inclination and continues until the further next horizontal sync signal, whereby the period for a scanning line to proceed from lefthand end to righthand end of a raster on a screen of said cathode ray tune is made substantially equal to a period for the next scanning line to proceed from righthand end to lefthand end, and wherein data is displayed during both of these periods, said horizontal deflection circuit including two voltage divider elements connected in seri s to a DC power supply, and a series connection of two switching elements connected in parallel with said two voltage divider elements, said horizontal deflection coil being connected between a junction of said two voltage divider elements and a junction of said two switching elements, and said two switching elements being responsive to the horizontal sync signal to be turned on alternately.

2. A CRT picture display apparatus according to claim 1, wherein said horizontal deflection circuit further comprises a flip-flop having two outputs, said flip-flop being reset by the vertical sync signal and thereafter each of the two outputs being changed over between high and low levels in response to the horizontal sync signal so that the two outputs become the high level alternately, said two switching elements being controlled by the two outputs of said flip-flop, respectively.

3. A CRT picture display apparatus according to claim 1, wherein said horizontal deflection circuit further comprises a counter being reset by the vertical sync signal and changing the content thereof by one in response to each horizontal sync signal, a memory for storing a plurality of correction values corresponding to the content of said counter and responding to an output value of said counter to produce one correction value corresponding to the content of said counter, and a converter for converting the output correction value of said memory into an analog signal, the output value of said converter being superimposed on the output of said DC power supply.

4. A CRT picture display apparatus according to claim 1, wherein said vertical deflection circuit further comprises a counter being reset by the vertical sync signal and changing the content thereof by one in response to each horizontal sync signal, a memory for storing a plurality of correction values corresponding to the content of said counter and responding to an output value of said counter to produce one correction value corresponding to the content of said counter, and converter means for converting the output value of said memory into an analog signal which in turn is fed to said vertical deflection coil.

5. A CRT picture display apparatus according to claim 1, wherein said display data generator means comprises a refresh memory for storing data of a picture to be displayed, and a shift register for receiving data for one scanning line from said refresh memory, said shift register being responsive to the horizontal sync signal to change the direction of shifting data.

* * * * *